United States Patent
Oishi

(10) Patent No.: US 8,482,344 B2
(45) Date of Patent: Jul. 9, 2013

(54) FREQUENCY-VARIABLE FILTER

(75) Inventor: Kazuaki Oishi, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/614,347

(22) Filed: Sep. 13, 2012

(65) Prior Publication Data

US 2013/0009699 A1    Jan. 10, 2013

Related U.S. Application Data

(63) Continuation of application No. PCT/JP2010/002025, filed on Mar. 23, 2010.

(51) Int. Cl.
*H03B 1/00*    (2006.01)

(52) U.S. Cl.
USPC ........................................ 327/553; 327/558

(58) Field of Classification Search
USPC ................... 327/551, 552, 553, 558
See application file for complete search history.

(56) References Cited

U.S. PATENT DOCUMENTS

| | | | | |
|---|---|---|---|---|
| 6,335,655 B1* | 1/2002 | Yamamoto | | 327/552 |
| 7,719,349 B2* | 5/2010 | Okada | | 327/553 |
| 7,764,116 B2* | 7/2010 | Mizumasa | | 327/553 |
| 7,852,147 B1* | 12/2010 | Mirzaei et al. | | 327/553 |
| 7,876,147 B1* | 1/2011 | An et al. | | 327/553 |
| 2005/0179505 A1 | 8/2005 | Di Giandomenico et al. | | |
| 2009/0096515 A1 | 4/2009 | Saitoh | | |

FOREIGN PATENT DOCUMENTS

| | | |
|---|---|---|
| JP | 08-139607 A | 5/1996 |
| JP | 2000-341089 A | 12/2000 |
| JP | 2002-359543 A | 12/2002 |
| JP | 2005-295460 A | 10/2005 |
| JP | 2008-085454 A | 4/2008 |
| WO | WO 2007/058012 A1 | 5/2007 |

* cited by examiner

*Primary Examiner* — Jeffrey Zweizig
(74) *Attorney, Agent, or Firm* — Arent Fox LLP

(57) ABSTRACT

A frequency-variable filter has a GmC filter having a plurality of OTAs and a capacitor; and a pseudo-random value generator outputting pseudo-random value of which average value in a predetermined time corresponds to an input setting value. And at least an OTA for determining a cut-off frequency, out of the plurality of OTAs, is controlled so that transconductance thereof is variably-controlled according to the pseudo-random values, and the cut-off frequency is variably-controlled based on the input setting value.

15 Claims, 15 Drawing Sheets

FIG. 9A

| SR | D6 | D5 | D4 | D3 | D2 | D1 | D0 | D7 | TOTAL |
|---|---|---|---|---|---|---|---|---|---|
| 4 | 1 | 1 | 1 | 1 | 1 | 1 | 1 | 1 | 8 |
| 3 | -1 | 1 | 1 | 1 | 1 | 1 | 1 | 1 | 6 |
| 2 | -1 | -1 | 1 | 1 | 1 | 1 | 1 | 1 | 4 |
| 1 | -1 | -1 | -1 | 1 | 1 | 1 | 1 | 1 | 2 |
| 0 | -1 | -1 | -1 | -1 | 1 | 1 | 1 | 1 | 0 |
| -1 | -1 | -1 | -1 | -1 | -1 | 1 | 1 | 1 | -2 |
| -2 | -1 | -1 | -1 | -1 | -1 | -1 | 1 | 1 | -4 |
| -3 | -1 | -1 | -1 | -1 | -1 | -1 | -1 | 1 | -6 |

FIG. 9B

| SR | D6 | D5 | D4 | D3 | D2 | D1 | D0 | D7 | TOTAL |
|---|---|---|---|---|---|---|---|---|---|
| 4 | 1 | 1 | 1 | 1 | 1 | 1 | 1 | 1 | 8 |
| 3 | 1 | 1 | 1 | 1 | 1 | 1 | 1 | -1 | 6 |
| 2 | 1 | 1 | 1 | 1 | 1 | -1 | 1 | -1 | 4 |
| 1 | 1 | 1 | 1 | -1 | 1 | -1 | 1 | -1 | 2 |
| 0 | 1 | -1 | 1 | -1 | 1 | -1 | 1 | -1 | 0 |
| -1 | 1 | -1 | -1 | -1 | 1 | -1 | 1 | -1 | -2 |
| -2 | -1 | -1 | -1 | -1 | 1 | -1 | 1 | -1 | -4 |
| -3 | -1 | -1 | -1 | -1 | -1 | -1 | 1 | -1 | -6 |

1 = H
-1 = L

FREQUENCY-VARIABLE FILTER

CROSS-REFERENCE TO RELATED APPLICATION

This application is a continuation application of International Application PCT/JP2010/002025 filed on Mar. 23, 2010 and designated the U.S., the entire contents of which are incorporated herein by reference.

FIELD

The embodiment relates to a frequency variable filter.

BACKGROUND

A receiving device of radio communication has a high frequency circuit that has: a mixer which down-converts a high frequency receive signal received by an antenna into an intermediate frequency or a base band; and a low-pass filter (LPF) which cuts off a high frequency component from an output signal of the mixer. The receive signal down-converted by the high frequency circuit is converted into a digital receive signal, and the digital receive signal is demodulated and error-corrected by a digital base band circuit.

For radio communication, high-speed data communication and communication with many terminals are demanded. Therefore a bandwidth allocated to one terminal may be changed according to a number of terminals. For example, if a number of terminals increases, a bandwidth allocated to each terminal is decreased so that many terminals communicate, and if a number of terminals decreases, a bandwidth allocated to each terminal is increased so that high-speed data communication is enabled.

Accordingly an LPF preferably variably-controls the cut-off frequency. For an LPF, an RC filter, and a GmC filter (transconductance and capacitance filter) or the like are widely used. The RC filter variably-controls the cut-off frequency by variably-controlling the cut-off frequency by variably controlling a feedback resistor or a feedback capacitor of an operational amplifier. The GmC filter has an OTA (Operational Transconductance Amplifier) which variably-controls the Gm (transconductance) instead of the input resistor and feedback resistor of the RC filter, and variably-controls the cut-off frequency by variably-controlling the Gm or the feedback capacitor of the OTA.

Known arts are Japanese Laid-open Patents 2005-295460, 2000-341089 and H08-139607.

In order to variably-control the cut-off frequency in the GmC filter, the Gm of the OTA is variably-controlled or a capacitance value of the feedback capacitor is variably-controlled. For this, many OTAs are provided, and a number of OTAs to be used is increased/decreased by a switch. Or many feedback capacitors are provided, and a number of capacitors to be used is increased/decreased by a switch.

However in either case, many OTAs and capacitors are formed if a high resolution of variable control is demanded, and therefore the (chip) area of the LSI increases. This means that if the GmC filter is created in a limited (chip) area, the resolution for variably-controlling the cut-off frequency decreases.

SUMMARY

With the foregoing in view, it is an object of the present invention to provide a frequency-variable filter with which the resolution of frequencies variably-controlled in a small area can be increased.

According to a first aspect of the embodiment, a frequency-variable filter has a GmC filter having a plurality of OTAs and a capacitor; and a pseudo-random value generator outputting pseudo-random value of which average value in a predetermined time corresponds to an input setting value, wherein at least an OTA for determining a cut-off frequency, out of the plurality of OTAs, is controlled so that transconductance thereof is variably-controlled according to the pseudo-random values, and the cut-off frequency is variably-controlled based on the input setting value.

According to this frequency-variable filter, the cut-off frequency can be variably-controlled with high resolution.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 9A and FIG. 9B are examples of a code table of the decoder according to this embodiment.

DESCRIPTION OF EMBODIMENTS

Embodiments of the present invention will now be described with reference to the drawings.

Figure 1:
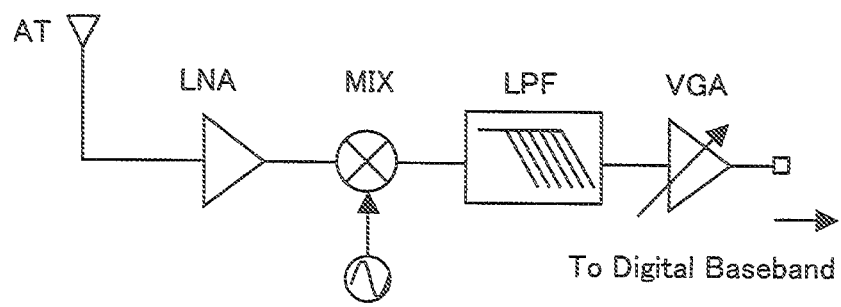
FIG. 1 is a diagram depicting an example of a configuration of a receiving device.

FIG. 1 is a diagram depicting an example of a configuration of a receiving device. The receiving device has: a low noise amplifier LNA which amplifies a high frequency receive signal received by an antenna in the case of a radio communication; a down-convert mixer MIX which down-converts the frequency of the amplified high frequency receive signal; a low-pass filter LPF that cuts the high frequency components of the output of the mixer, and allows low frequency components to pass; and a variable gain amplifier VGA which amplifies the output of the low-pass filter. The output of the variable gain amplifier VGA is converted into a digital signal, and is input to a digital base band signal processing unit, which is not illustrated.

Figure 2A:
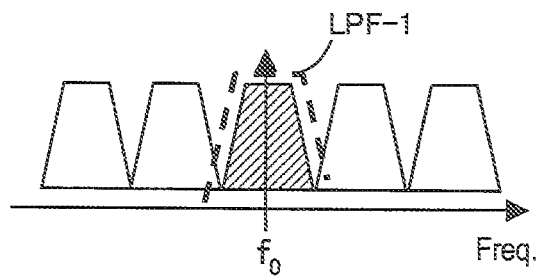
FIG. 2A and FIG. 2B are diagrams depicting a characteristic of the low-pass filter used for radio communication.
Figure 2B:
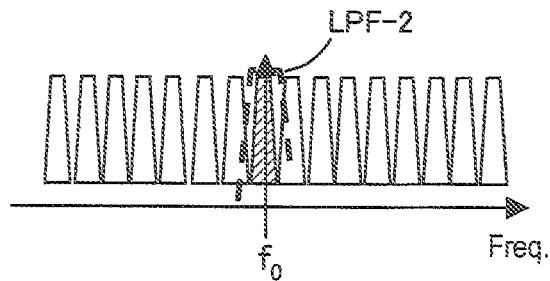

FIG. 2A and FIG. 2B are diagrams depicting a characteristic of the low-pass filter used for radio communication. In radio communication, it is demanded that, within limited frequency bands, frequency bands are allocated to as many terminals as possible, and the frequency band allocated to each terminal is as wide as possible, so that high-speed data communication is available. Therefore if a number of terminals to communicate is small, a wide frequency band is allocated to each terminal so as to enable high-speed data communication, as illustrated in FIG. 2A, and if a number of terminals to communicate is large, a narrow frequency band is allocated to each terminal so that a maximum number of terminals communicate, as illustrated in FIG. 2B.

In FIG. 2A and FIG. 2B, if a central frequency of a frequency band allocated to a terminal is f0, the central frequency f0 becomes zero or an intermediate frequency in the down-converted receive signal. In the case of FIG. 2A, the characteristic of the LPF in the receiving device is controlled to be the characteristic LPF-1 indicated by the broken line, and in the case of FIG. 2B, the characteristic of the LPF is controlled to be the characteristic LPF-2 indicated by the broken line. This means that the LPF is controlled in such a way that the cut-off frequency becomes high in the case of the characteristic LPF-1, and the cut-off frequency becomes low in the case of the characteristic LPF-2.

Figure 3:
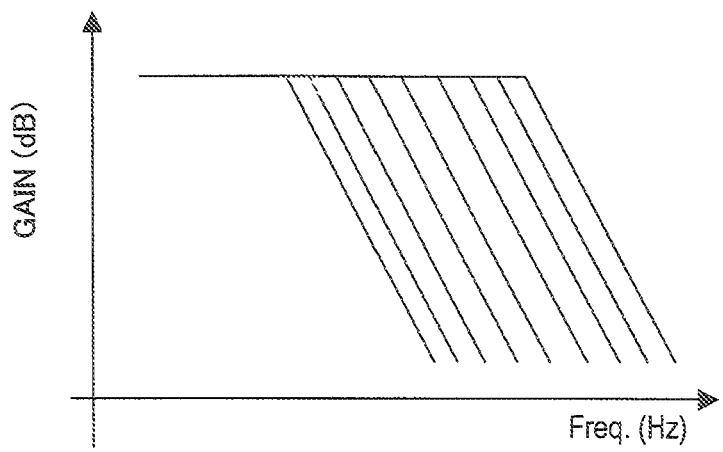
FIG. 3 is an example of controlling the frequency characteristic of the low-pass filter.

FIG. 3 is an example of controlling the frequency characteristic of the low-pass filter. In FIG. 3, the abscissa is the frequency, and the ordinate is the gain. If the cut-off frequency of the low-pass filter LPF is variably-controlled with fine resolution, as illustrated, the frequency band to be provided to the number of terminals illustrated in FIG. 2A and FIG. 2B is controlled with fine resolution.

First Embodiment

Figure 4:
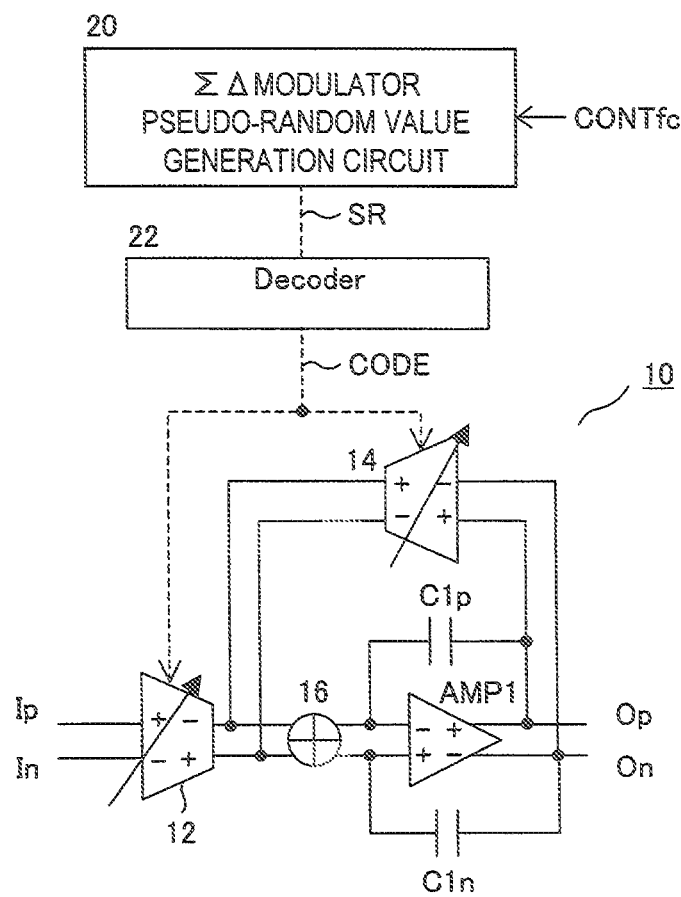
FIG. 4 is a diagram depicting a configuration of a frequency-variable filter according to a first embodiment.

FIG. 4 is a diagram depicting a configuration of a frequency-variable filter according to a first embodiment. This frequency-variable filter has: a GmC filter 10 which allows the low frequency components of the input signals of the input terminals Ip and In to pass, and cuts the high frequency components thereof off, and outputs the filtered signals to the output terminals Op and On; a pseudo-random value generation circuit 20 which generates a pseudo-random value SR corresponding to a cut-off frequency setting signal CONTfc; and a decoder 22 which converts the pseudo-random value SR into a control code CODE.

The GmC filter 10 is a first order LPF, and has: a first input-side OTA 12 which converts a differential input voltage of the input terminals Ip and In into a differential current; first capacitors C1p and C1n which generate differential voltage for the output terminals Op and On based on the differential output current of the input-side OTA 12; and a first feedback-side OTA 14 which is disposed between the output terminals Op and On and the first input-side OTA 12.

The GmC filter 10 of the example in FIG. 4 has an adder 16 which adds the output current of the input-side OTA 12 and the output current of the feedback-side OTA 14. However the adder 16 may be simply connections of the outputs of the input-side OTA 12 and the feedback-side OTA 14, since the output currents are added simply by connecting the output terminals of these OTAs.

The GmC filter 10 of the example in FIG. 4 also has an operational amplifier AMP1, which generates output voltages in the output terminals Op and On based on the current added by the adder 16. The current from the adder 16 is stored in the feedback capacitors C1p and C1n, and is output as voltages to the output terminals Op and On. This is because the inputs of the operational amplifier AMP1 become virtual ground potential, and voltages are generated in Op and On, which are the opposite-side terminals of the feedback capacitors C1p and C1n.

Instead of the operational amplifier AMP1, a capacitor pair C1p and C1n may be disposed between the output terminal pair and the ground. This example will be described later.

The GmC filter 10 has a cut-off frequency fc corresponding to the transconductance Gm of the first feedback-side OTA 14 and the capacitance value C of the first capacitors C1p and C1n. The GmC filter 10 has a gain corresponding to the ratio of the Gm between the first input-side OTA 12 and the first feedback-side OTA 14.

In other words, the cut-off frequency fc is in proportion to Gm/C. Since Gm=1/R, this is equivalent to that the cut-off frequency fc is proportion to 1/RC in the case of an RC filter. In other words, if the Gm of the feedback-side OTA 14 is small (high resistance) or if the capacitors C1p and C1n are large, the operational amplifier, the feedback-side OTA and the capacitors C1p and C1n do not follow up with the high frequency input, and the cut-off frequency fc becomes low. The gain of the GmC filter is also equivalent to the gain of the RC filter, determined corresponding to the ratio of the input resistance and the feedback resistance.

The pseudo-random value generation circuit 20 generates pseudo-random values SR corresponding to the input setting value CONTfc at high frequency, so that an average value of the pseudo-random values within a predetermined time takes a value corresponding to the input setting value. It is preferable that noise components of the pseudo-random values are diffused more to a higher frequency side than the cut-off frequency. A $\Sigma\Delta$ modulator is known as a pseudo-random value generator that has such characteristic. In this embodiment, the pseudo-random values are generated by the later-described $\Sigma\Delta$ modulator.

Then at least the feedback-side OTA 14, the transconductance Gm thereof is variably-controlled according to the pseudo-random values, and the cut-off frequency is variably-controlled based on the input setting value of the $\Sigma\Delta$ modulator. In concrete terms, the first feedback-side OTA 14 has a plurality of unit-OTAs, which are connected in parallel, the output currents of the plurality of unit-OTAs are variably-controlled to have positive phase or a negative phase according to the pseudo-random value SR, and the output currents of the plurality of unit-OTAs are added, whereby the transconductance of the OTA 14 is variably-controlled.

In the case of the example in FIG. 4, the pseudo-random values SR are converted into control codes CODE by the decoder 22, and the control codes CODE are provided to the feedback-side OTA 14. By the control codes CODE, the output currents of the plurality of unit-OTAs in the OTA 14 are controlled to have a positive phase or a negative phase, whereby the transconductance Gm of the OTA 14 is variably-controlled.

In the case of the example in FIG. 4, the input-side OTA 12 also has a plurality of unit-OTAs which are connected in parallel, the control codes CODE are also provided to the input-side OTA 12, and the transconductance Gm of the input-side OTA 12 is variably-controlled as well. Providing a same control code to both of the OTAs allows to variably-control the transconductance Gm of the OTAs in the same way, and the ratio of the Gm between the OTAs can be kept constant. This means that the gain is kept constant while variably-controlling the cut-off frequency. This point will also be described later.

Figure 5:
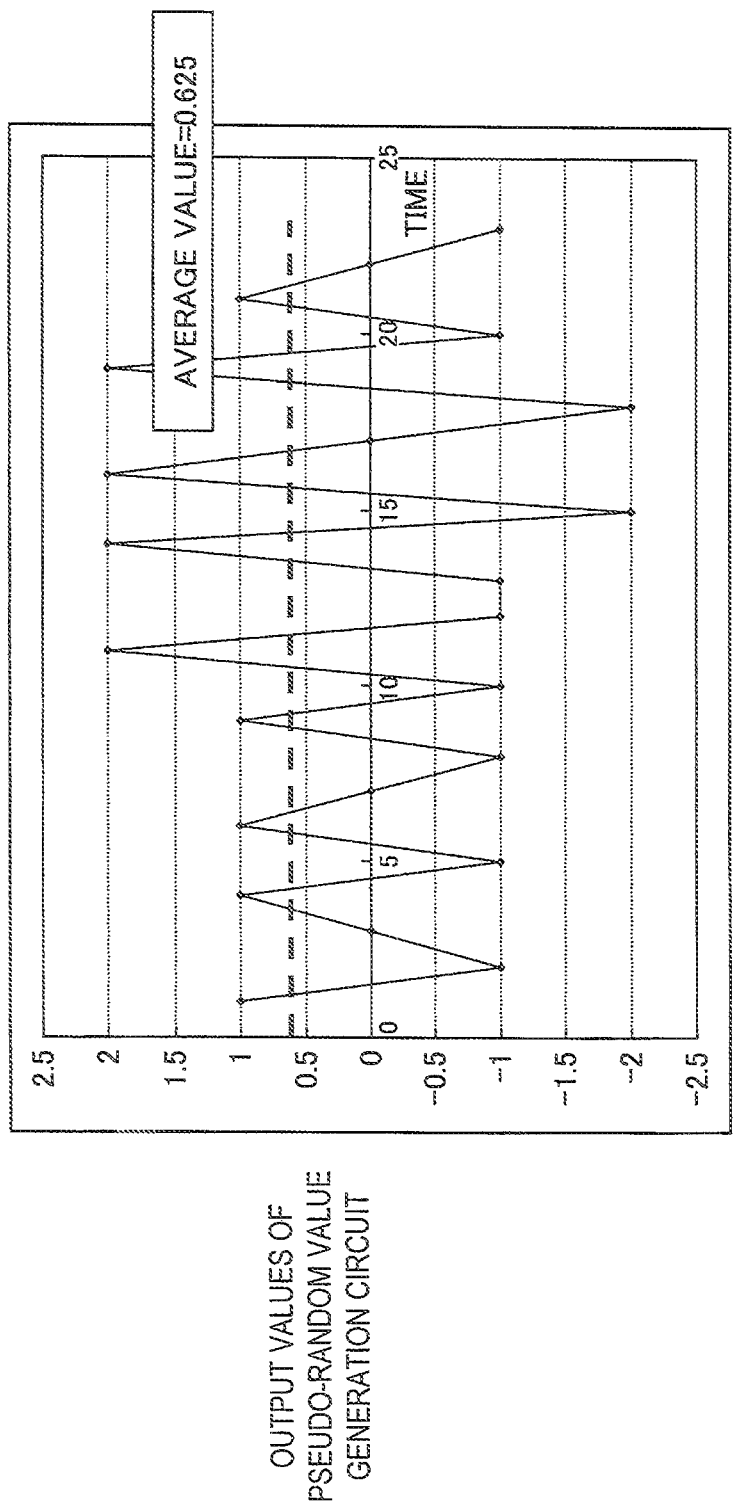
FIG. 5 is a diagram depicting an example of the output of the pseudo-random value generation circuit 20 according to this embodiment.

FIG. 5 is a diagram depicting an example of the output of the pseudo-random value generation circuit 20 according to this embodiment. The output values of the pseudo-random value generation circuit become pseudo-random values, and the average value of the output values increases as the setting signal CONTfc increases, and the average value of the output values decreases as the setting signal CONTfc decreases.

In the case of the example in FIG. 5, the output values change as 1, −1, 0, 1, −1, 1, 0, −1, 2, −1, −1, 2, −2, 2, 0, −2, 2, −1, 1, 0 and −1, synchronizing with a clock. An average value thereof over a long time is 0.625. In this way, even if the pseudo-random values of the output take a small number of discrete values (2, 1, 0, −1 and −2) and even if resolution is low, an average value within a predetermined time has a higher resolution than the discrete values of the output since the output values change at high-speed synchronizing with the clock. If this is used, an average value of transconductance values Gm of unit-OTAs is allowed to be variably-controlled with a resolution higher than the number of unit-OTAs, even if a number of unit-OTAs in the OTA is small, because the pseudo-random values are used for signals to control the unit-OTAs.

Therefore even if the (chip) area is decreased by decreasing the number of unit-OTAs of the feedback-side OTA, the Gm of the OTA is variably-controlled with a high resolution, hence the cut-off frequency of the filter is variably-controlled with a high resolution.

It is known that if the $\Sigma\Delta$ modulator is used for the pseudo-random generation circuit 20, the noise components are clustered in the high frequency bands. Therefore if the feedback-side OTA 14 is controlled using the pseudo-random values generated by the $\Sigma\Delta$ modulator, the frequency components that are higher than the cut-off frequency of the filter, out of the noise components of the pseudo-random values to be converted with a high frequency, are removed by the function of the LPF.

Figures 6A, 6B:
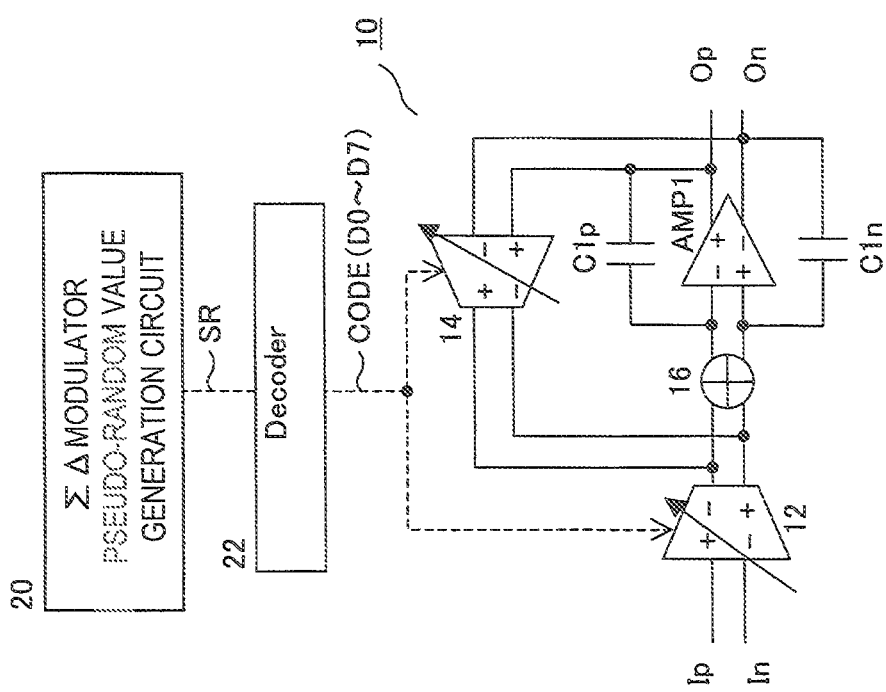
FIG. 6A and FIG. 6B are diagrams depicting an example of a configuration of a GmC filter, which is the frequency-variable filter according to this embodiment.

FIG. 6A and FIG. 6B are diagrams depicting an example of a configuration of a GmC filter, which is the frequency-variable filter according to this embodiment. FIG. 6A illustrates: the first order GmC filter 10, that is the same as FIG. 4; the pseudo-random value generation circuit 20 for generating the control codes CODE for controlling the Gm thereof; and the decoder 22. FIG. 6B is a diagram depicting a configuration example of the first feedback-side OTA 14 and the first input-side OTA 12 in the GmC filter 10. In order to variably-control the cut-off frequency fc using the pseudo-random values, at least the first feedback-side OTA 14 has this configuration. In the embodiment in FIG. 6A, both of the OTA 12 and the OTA 14 have the configuration illustrated in FIG. 6B.

The OTA 14 and the OTA 12 in FIG. 6B are for converting the differential input voltage into the differential output current, and eight unit-OTAs (U-OTA) and eight mixers MIX, which switch the output currents of the eight unit-OTAs (U-OTA) to have a positive phase or a negative phase respectively, are connected in parallel between the input terminals I1p and I1n and the output terminals O1n and O1p. Each unit-OTA (U-OTA) generates a differential output current corresponding to the differential input voltage. Then each mixer MIX switches the differential output current to have a positive phase or a negative phase based on 8-bit control codes CODE (D0 to D7) generated from the pseudo-random values SR. The differential output current of which phase is switched to a positive phase or a negative phase by the mixer is added by the output terminals O1p and O1n. As a result, the OTA 14 or the OTA 12 constituted by eight unit-OTAs output eight discrete differential output currents from the output terminals O1n and O1p. This means that OTA 14 or OTA 12 is variably-controlled to have eight discrete transconductance Gms.

Figure 7D:
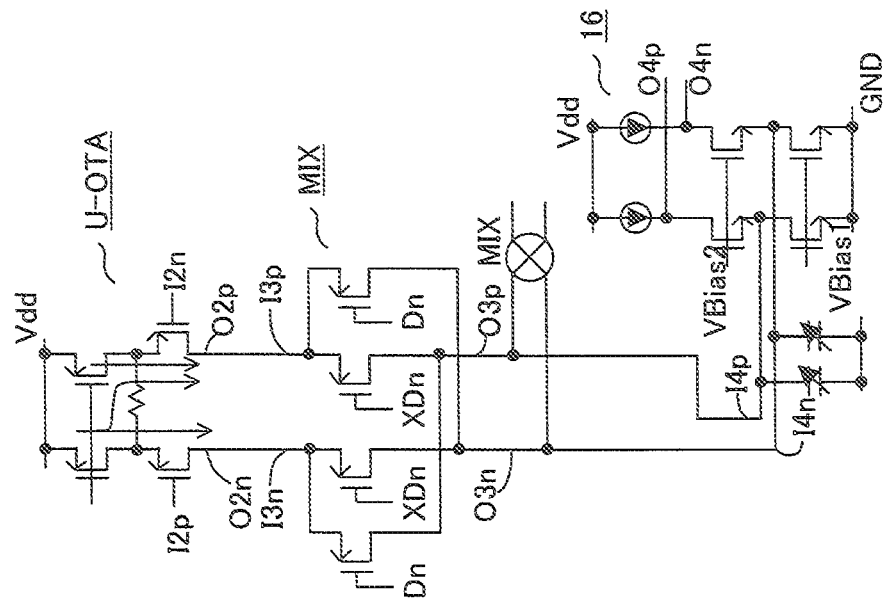
FIG. 7A to FIG. 7D are diagrams depicting configurations of the OTAs according to this embodiment.
Figure 7A:
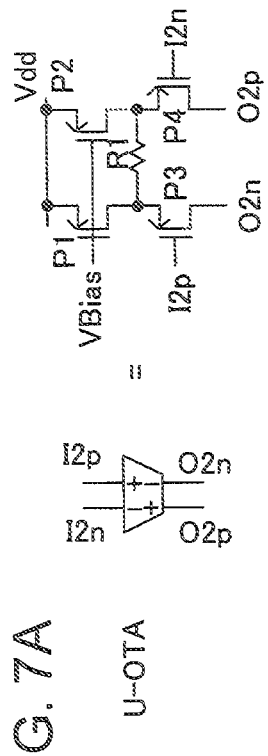

FIG. 7A to FIG. 7D are diagrams depicting configurations of the OTAs according to this embodiment. FIG. 7A is a configuration of a unit-OTA (U-OTA). The unit-OTA (U-OTA) is a degeneration type differential transistor pair P3 and P4, and has: P-channel transistors P1 and P2 where sources are connected to the power supply Vdd and bias voltage Vbias is applied to the gate so as to function as a current source; P-channel transistors P3 and P4 which are a differential pair of which sources are connected to the transistors P1 and P2, gates are connected to the input terminals I2p and I2n, and drains are connected to the output terminals O2n and O2p respectively; and a resistor R1 which is disposed between the sources of the transistors P3 and P4. If the differential input voltages of the input terminals I2p and I2n are I2p>I2n, current flows more to the transistor P4 side than to the transistor P3 side, and the differential output currents to be output to the output terminals O2p and O2n becomes the relationship O2p>O2n.

Figure 7B:
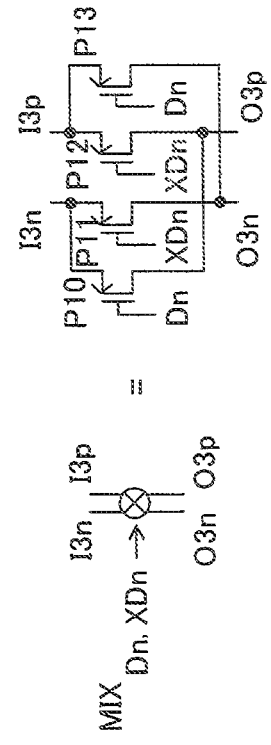

FIG. 7B is a configuration of the mixer MIX. The mixer MIX has P-channel transistors P10 to P13. When the control codes are Dn=H and XDn=L, the transistors P11 and P12 turn ON, and the mixer MIX supplies the currents of the input terminals I3p and I3n to the output terminals O3p and O3n respectively, and outputs the differential current in the positive phase. When the control codes are Dn=L and XDn=H, the transistors P10 and P13 turn ON, and the mixer MIX supplies the currents of the input terminals I3p and I3n to the output terminals O3n and O3p respectively, and outputs the differential current in the negative phase. In other words, the mixer MIX switches the differential output current of the unit-OTA to have a positive phase or a negative phase based on the control codes.

Figure 7C:
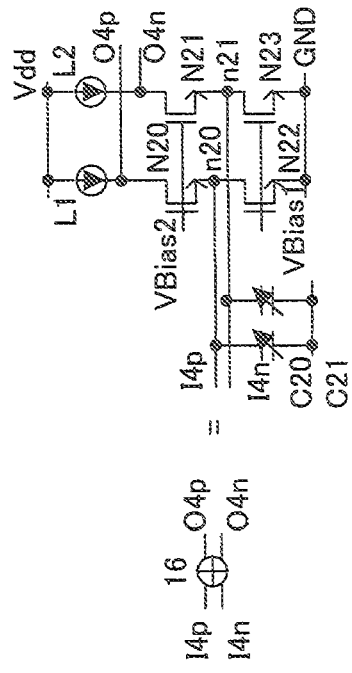

FIG. 7C is a configuration example of the addition circuit 16. As FIG. 6A illustrates, the addition circuit 16 adds the output currents of the input-side OTA 12 and the feedback-side OTA 14. The addition circuit 16 has cascade-connected N-channel transistor pairs N20 and N22 and N21 and N23, of which gates are biased to predetermined voltages Vbias1 and Vbias2 respectively, and these N-channel transistor pairs N20 and N2 and N21 and N23 are between the constant current sources L1 and L12 and the ground GND. The input terminals I4p and I4n of the addition circuit are connected to the connection terminals n20 and n21 of the cascade-connected transistor pair respectively. The capacitors C20 and C21 cut the high frequency noise of the input.

In the case of a predetermined amount of input current being supplied from the input terminals I4p and I4n, the currents of the constant current sources L1 and L2 are supplied to the transistor pair N20 and N22 and the transistor pair N21 and N23 respectively, and the input currents are supplied to the transistors N22 and N23, therefore a balanced state is generated, and output currents are not generated in the output terminals O4p and O4n. In the transistor pair N20 and N22 and in the transistor pair N21 and N23, the gates are biased with a fixed bias voltage respectively, therefore fixed currents are supplied.

The more the input current is supplied from the input terminal I4p or I4n, less current is supplied to the transistor N20 or N21 accordingly. This is because the transistors N22 and N23 are constant current sources, and the sum of the current supplied to the transistor N20 or N21 and the input current I4p or I4n becomes a predetermined current (current of N22 or N23). The constant current sources L1 or L2 also supplies a predetermined current, hence if a current of the transistor N20 or N21 decreases, the differential current thereof is output from the O4p or O4n terminal. If input current supplied to the input terminal I4p or I4n decreases, the current supplied to the transistor N20 or N21 increases, and the difference of this current and the current of L1 or L2 is output from the O4p or O4n terminal.

FIG. 7D is a diagram depicting the connection of the unit-OTA, the mixer MIX and the addition circuit 16. Thus the differential output current, which the unit-OTA (U-OTA) converted from differential input voltage, is switched to have a positive phase or a negative phase by the mixer MIX using the control codes Dn and XDn, and outputs of the eight mixers MIX are collected and added in the addition circuit 16. As a result, in the OTA 12 or OTA 14 having an eight unit-OTAs, the output current amount is variably-controlled based on the control codes Dn and XDn, and the transconductance Gm is variably-controlled.

All the OTAs in FIG. 7A to FIG. 7D are completely constituted by P-channel transistors except the addition circuit. However these OTAs may also be completely constituted by N-channel transistors. In this case, in FIG. 7D, the power supply Vdd is replaced with a ground, and the ground GND is replaced with a power supply Vdd. The addition circuit is constituted by P-channel transistors.

Figure 8:
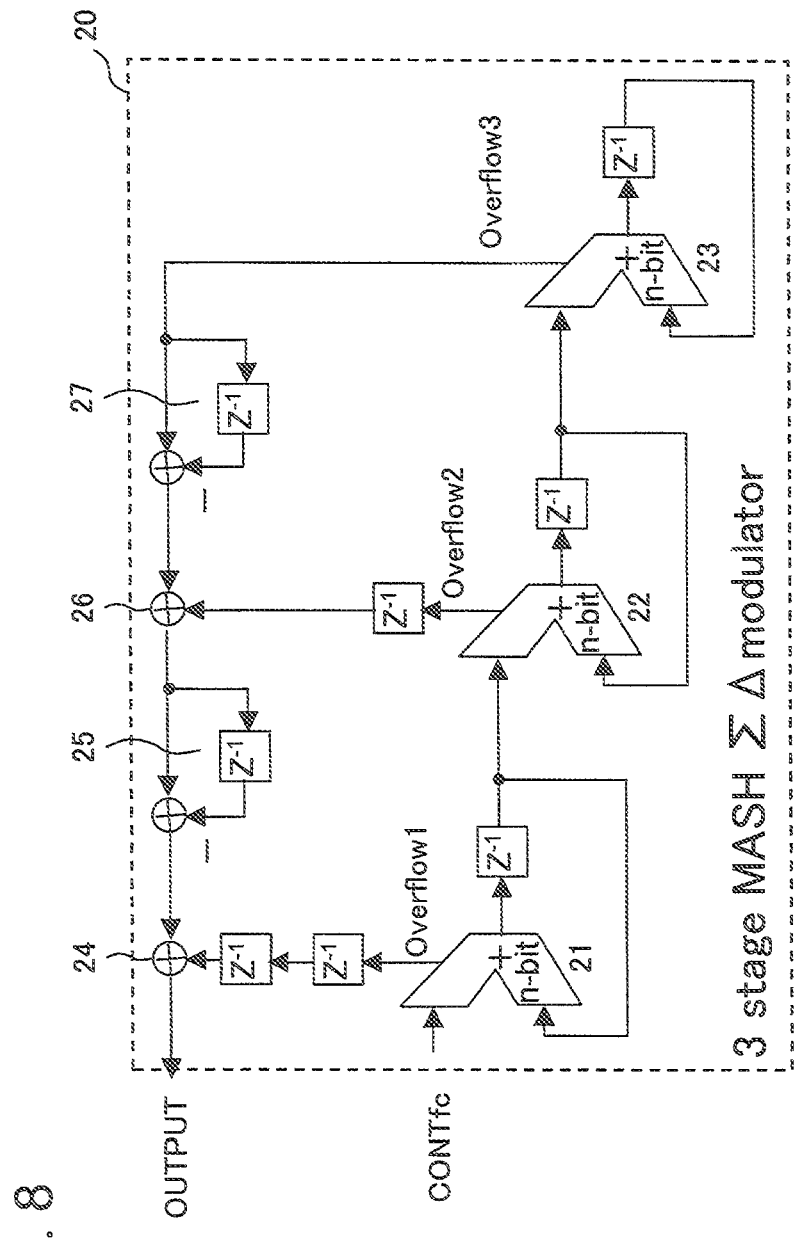
FIG. 8 is a diagram depicting a ΣΔ modulator, which is an example of a pseudo-random value generation circuit according to this embodiment.

FIG. 8 is a diagram depicting a ΣΔ modulator, which is an example of a pseudo-random value generation circuit 20 according to this embodiment. The ΣΔ modulator adds the setting signal CONTfc synchronizing with a clock, and generates an output value based on overflow thereof. The ΣΔ modulator has a three-step configuration, and has: an adder 21 which adds the input set value CONTfc, which is a digital value, synchronizing with a clock; an adder 22 which adds the added value by the adder 21 at a timing delayed by one clock, and an adder 23 which adds the added value by the adder 22 at a timing delayed one clock. $Z^{-1}$ is a one clock delay circuit. Overflow of the adder 23 is differentiated by a differentiation circuit 27, and is added with the overflow of the adder 22 by an adder 26, and this added value is differentiated by the differentiation circuit 25, and is added with the overflow of the adder 21 by an adder 24. This is an output value, that is a pseudo-random value. The differentiation circuit 25 or 27 is configured in such a way that a difference is determined by subtracting a value at a timing one clock before. Operation of the ΣΔ modulator is known to those skilled in the art.

FIG. 9A and FIG. 9B are examples of a code table of the decoder according to this embodiment. FIG. 9A and FIG. 9B depict two types of code tables. In the code table in FIG. 9A, output codes D0 to D7, with respect to a pseudo-random value SR to be input, are depicted. With respect to eight input values SR4 to SR-3, the output codes D0 to D7 are depicted sequentially from all "1s", to one "1" and seven "-1s". It is assumed that a high potential signal H is output if an output code D0 to D7 is "1", and low potential signal L is output if an output code D0 to D7 is "-1". The total value of 8, 6, 4, 2, 0, -2, -4 and -6 indicates an output current value of the output terminal O4p or O4n of the OTA 12 or OTA 14. The differential output current is highest at the positive side when the total is 8, and the differential output current is highest at the negative side when the total is -6. In other words, the OTA outputs a discrete output current corresponding to the input value SR by controlling the mixer of the OTA using the control codes D0 to D7 generated based on the input value SR.

In the code table in FIG. 9B, output codes D0 to D7, with respect to the eight input values SR4 to SR-3 are sequentially depicted from all "1s", to one "1" and seven "-1s".

This table depicts an example in the case when the input value DR is output in the sequence of 4, 3, 2, 1, 0, -1, -2 and -3, for purposes of description. 1 starts to be output when the previous output code changes from 1 to -1. For example, in the case of SR=2, 1 and -1 are switched between D3 and D4, and in the case of the next time, that is SR=1, 1 starts to be output in D4, where 1 was switched to -1 the previous time, and 1 is output five times in D5, D6, D7 and D0, and -1 is output in D1, D2 and D3. Thereby a unique offset, of each unit-OTA, can be appropriately cancelled. If the mixer of the output code D7 always becomes in a same state, as shown in the example in FIG. 9A, this means that the offset component of a corresponding unit-OTA for D7 always exists. In this example, a case of the input SR sequentially changes as 4, 3, 2, 1, 0, -1, -2 and -3 for purposes of description, but in an actual circuit, the input SR is a pseudo-random value.

Referring back to the filter in FIG. 6A, the feedback-side OTA 14 has a relatively small number of unit-OTAs (U-OTA) (eight U-OTAs in this case), switching the output currents of these unit-OTAs to have a positive phase or a negative phase using the control codes CODE (D0 to D7) converted from pseudo-random values SR, and adding the output currents, as described above. Thereby the Gm value (Gm=Iout/Vin) of the feedback-side OTA 14 is variably-controlled to eight discrete values corresponding to the pseudo-control values. A pseudo-random value is an 8-bit code which changes at high frequency, and an average value of the Gm values in a predetermined time has a high resolution, even if a number of unit-OTAs is small, and a number of Gm values that is controlled instantaneously is small. If the Gm values of the feedback-side OTA 14 are variably-controlled with high resolution, the cut-off frequency fc of the filter is also controlled with high resolution.

In the filter in FIG. 6A, the input side-OTA 12 also has a configuration similar to the feedback-side OTA 14, and the Gm value thereof is variably-controlled using the same control codes CODE. As a result, a ratio of the Gm value of the input-side OTA 12 and the Gm value of the feedback-side OTA 14 is kept at a constant value. This means that the cut-off frequency fc is variably-controlled, but gain is kept at a constant value. This characteristic is described later.

Figure 10:
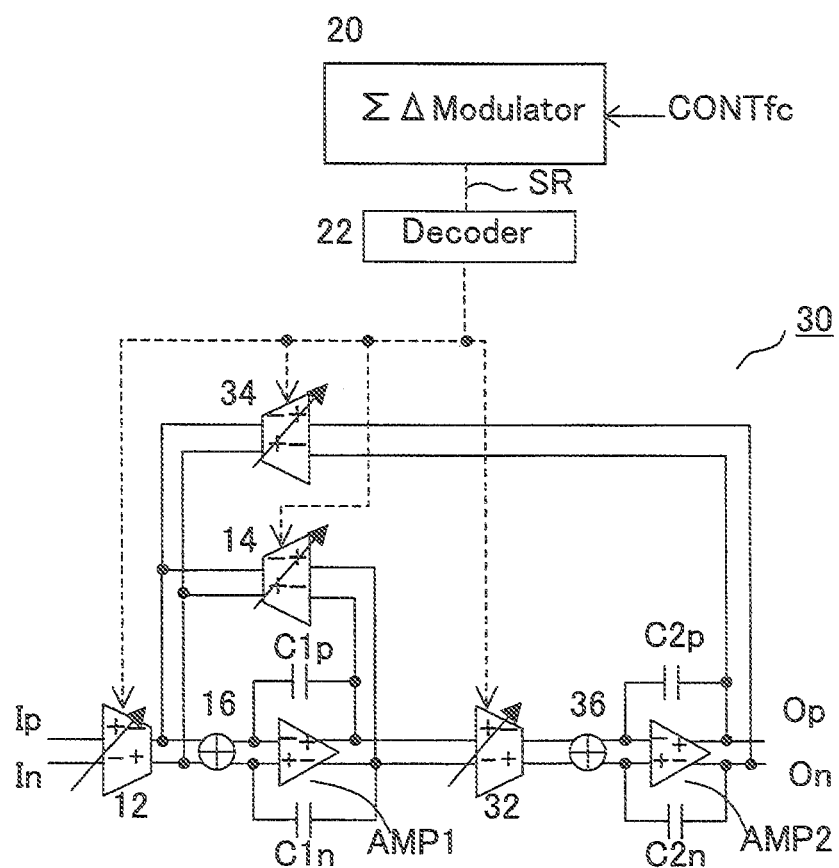
FIG. 10 is a diagram depicting a configuration of a GmC filter of the frequency-variable filter according to this embodiment.

FIG. 10 is a diagram depicting a configuration of a GmC filter of the frequency-variable filter according to this embodiment. While the GmC filter in FIG. 6A is a first order LPF, the GmC filter in FIG. 10 is a second order LPF. In addition to the first input-side OTA 12, the first operation amplifier AMP1, the first feedback-side OTA 14, the first feedback capacitors C1p and C1n, and the adder 16 constituting the first order LPF in FIG. 6A, the second order LPF has a second input-side OTA 32, a second operational amplifier AMP2, a second feedback-side OTA 34, a second feedback capacitors C2p and C2n, and a second adder 36. These four OTAs have a same configuration as the OTAs depicting in FIGS. 6 and 7.

While in the first order LPF, a gain around the cut-off frequency decreases by a power of the frequency, a gain around the cut-off frequency decreases by a square of the frequency in the case of the second order LPF. The change characteristic of the gain, with respect to the frequency, is controlled in various ways.

In the example in FIG. 10, the control codes CODE (D0 to D7) generated by decoding the pseudo-random values SR are provided to all the OTAs 12, 14, 32 and 36 in the same manner. The cut-off frequency changes according to the Gm value of the OTAs 14, 32 and 36. Mutually different codes may be provided to these four OTAs so that the Gm value is controlled independently. In this case, the pseudo-random value generation circuit 20 and the decoder 22 are needed for each OTA.

Figure 11:
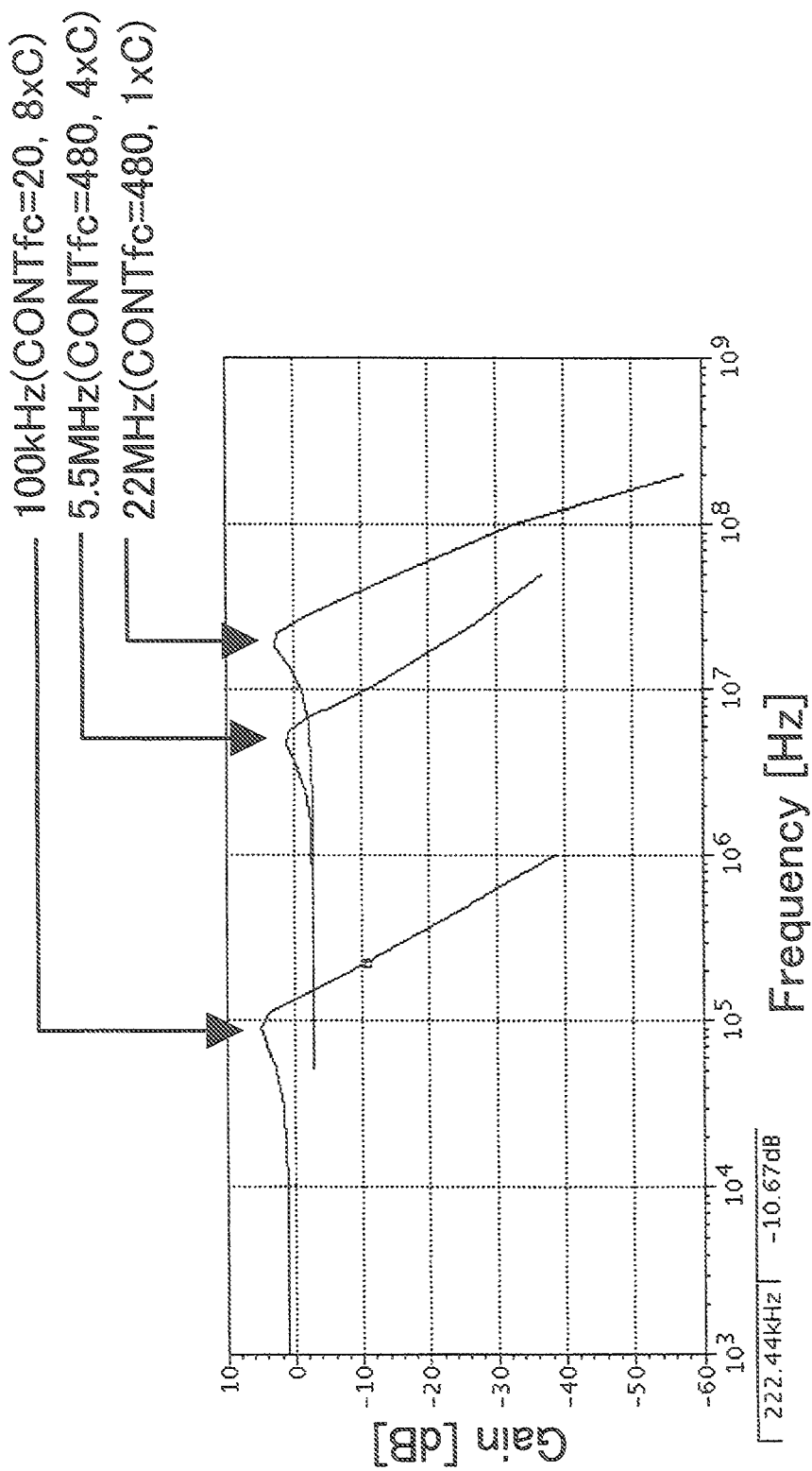
FIG. 11 is a graph depicting the frequency characteristics of the second order LPF of this embodiment based on simulation.

FIG. 11 is a graph depicting the frequency characteristics of the second order LPF of this embodiment based on simulation. The abscissa is the frequency and the ordinate is the gain. This is a case when the input OTA 12 of the second order LPF in FIG. 10 is not controlled by the ΣΔ modulator, but by a general variable OTA. Three frequency characteristics when the ΣΔ modulator outputs the pseudo-random values, and the setting value CONTfc in the ΣΔ modulator, and the capacitances of the feedback capacitors C1 and C2 are variably set are depicted. As the graph depicts, the cut-off frequency fc is controlled to 100 KHz, 5.5 MHz and 22 MHz respectively.

Second Embodiment

Figure 12B:
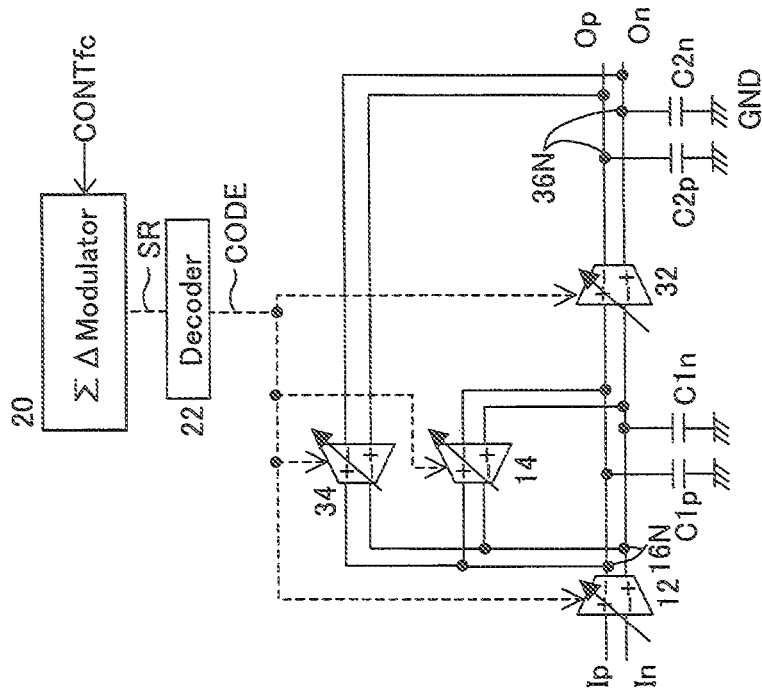
FIG. 12A and FIG. 12B are diagrams depicting a configuration of a GmC filter according to a second embodiment.
Figure 12A:
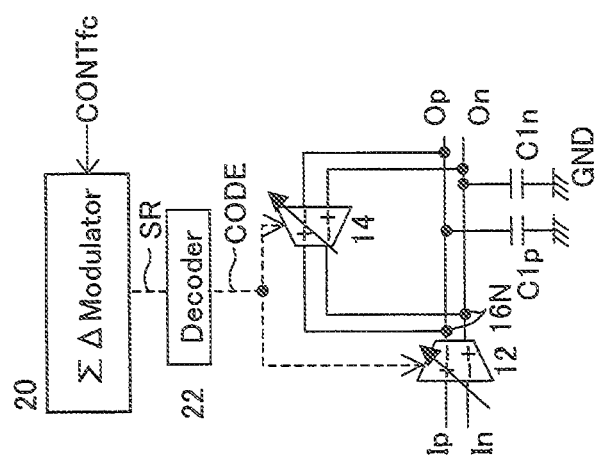

FIG. 12A and FIG. 12B are diagrams depicting a configuration of a GmC filter according to a second embodiment. FIG. 12A illustrates a first order LPF, and FIG. 12B illustrates a second order LPF. Compared with FIG. 6A, the first order LPF in FIG. 12A has no operational amplifier AMP1, instead it has the capacitors C1p and C1n which are disposed between the output terminals Op and On and the ground, and these capacitors convert a differential output current of the input-side OTA 12 into a differential output voltage, and outputs the differential output voltage to the output terminals Op and On. Furthermore only the connection node 16N is disposed instead of the adder 16. In the example in FIG. 12A, the control codes CODE are provided to both the OTA 12 and OTA 14. Different control codes CODE may be provided to the OTA 12 and the OTA 14.

Compared with the first order LPF in FIG. 10, the second order LPF in FIG. 12B has no operational amplifier, instead it has capacitors C1p and C1n, which are disposed between the input of the second input-side OTA 32 and the ground GND, and these capacitors converts a differential output current of the input-side OTA 12 into a differential output voltage, and outputs the differential output voltage to the terminals Op and On on the second input-side OTA 32. In the same manner, the capacitors C2p and C2n are disposed between the output terminals Op and On and the ground, and these capacitors convert the differential output current of the input-side OTA 32 into a differential output voltage, and output the differential output voltage to the output terminals Op and On. Furthermore only the connection nodes 16 and 36 are disposed instead of the adders 16N and 36N. In the example in FIG. 12B, the control codes CODE are provided to four OTAs 12, 14, 32 and 34. Different control codes CODE may be provided to the OTAs 12, 14, 32 and 34.

In the second order LPF in FIG. 10 and in the second order LPF in FIG. 12B, the cut-off frequency fc and the gain characteristic around the cut-off frequency are determined corresponding to the transconductance Gm of the OTAs 14, 32 and 34. Therefore the control codes CODE may be provided only to these OTAs so as to variably-control the Gm thereof, while the Gm of the first input-side OTA 12 is fixed or variably-controlled using different control codes.

Figure 13:
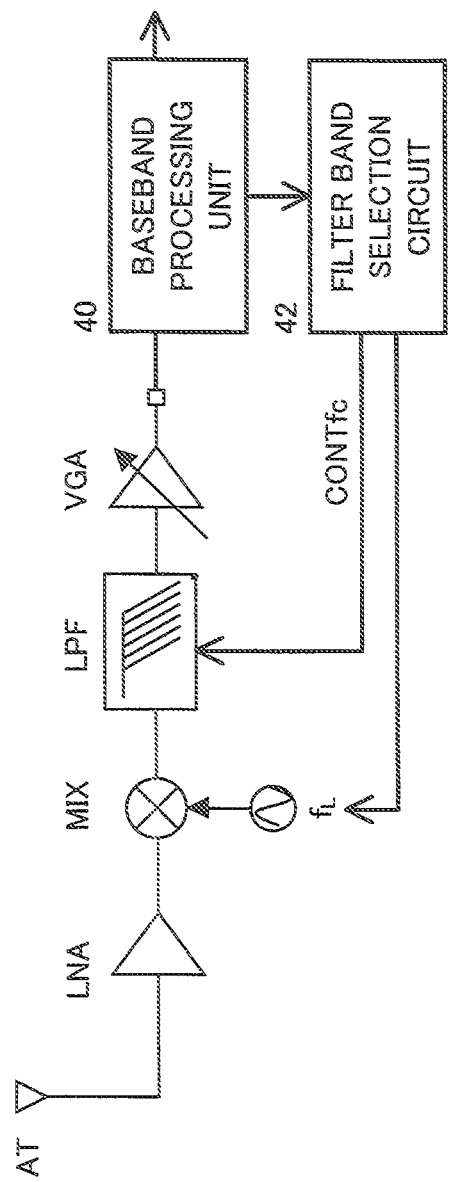
FIG. 13 is a diagram depicting a configuration of a radio receiving device having the LPF of this embodiment.

FIG. 13 is a diagram depicting a configuration of a radio receiving device having the LPF of this embodiment. This receiving device has an antenna AT, a low noise amplifier LNA, a down-mixer MIX, a low-pass filter LPF, a variable gain amplifier VGA, a baseband processing unit 40, and a filter band selection circuit 42. The LPF of this embodiment is used for the low-pass filter LPF, and the filter band selection circuit 42 outputs the input setting value CONTfc of the low-pass filter LPF based on the signal from the baseband processing unit 40. In other words, the filter band selection circuit 42 controls the local frequency fL of the down-converter and the input setting value CONTfc for setting the cut-off frequency of the low-pass filter LPF according to a frequency band allocation signal from the base station.

Figures 14A, 14B:
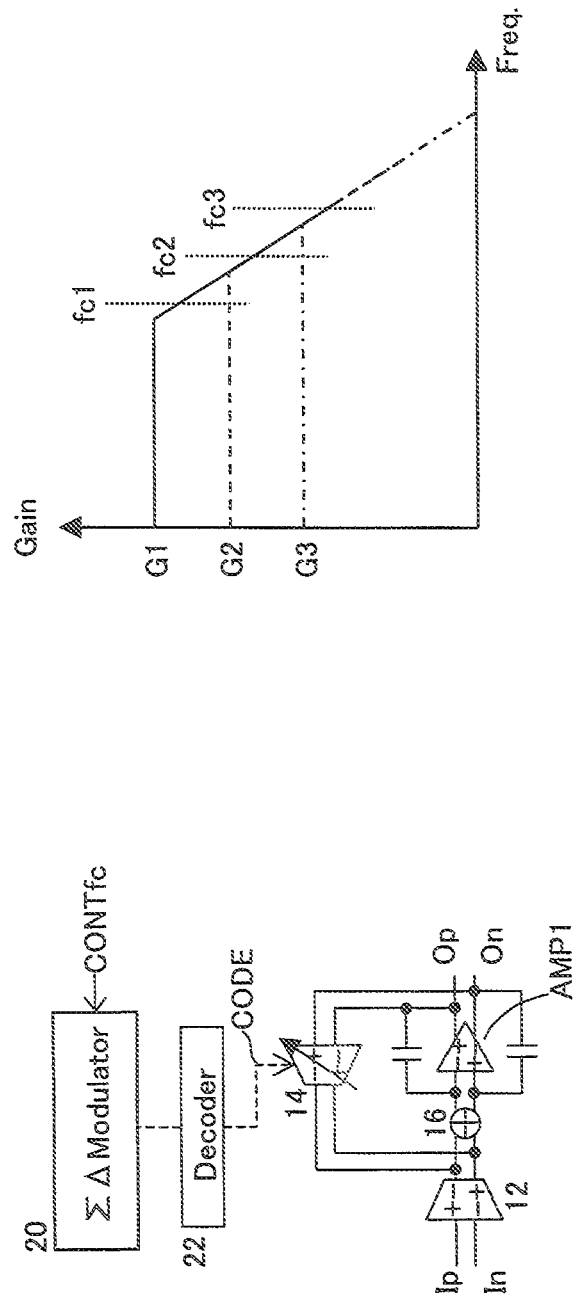
FIG. 14A and FIG. 14B are diagrams depicting an example of a first GmC filter and characteristics thereof.

FIG. 14A and FIG. 14B are diagrams depicting an example of a first GmC filter and characteristics thereof. The GmC filter depicted in FIG. 14A is a first order LPF, but the control codes CODE from the decoder 22 are provided only to the feedback-side OTA 14, and the Gm value of the feedback-side OTA 14 is variably-controlled with a high resolution corresponding to the input setting value CONTfc, while the Gm value of the input-side OTA 12 is fixed.

In the case of such a GmC filter, the frequency and the gain characteristics thereof are variably-controlled as the cut-off frequency fc1, fc2 and fc3 corresponding to the input setting value CONTfc, as depicted in FIG. 14B, but since the gain is in proportion to the ratio of the Gm value of the input-side OTA 12 and that of the feedback-side OTA 14, the respective gains change as G1, G2 and G3 if the Gm value of the input-side OTA 12 is fixed.

The frequency and the gain characteristics in FIG. 14B is also obtained here by controlling the three OTAs 14, 32 and 34, other than the first input-side OTA 12 in the second order LPF in FIG. 10 and FIG. 12B, using common control codes CODE, and fixing the Gm value of the first input-side OTA 12.

Figures 15A, 15B:
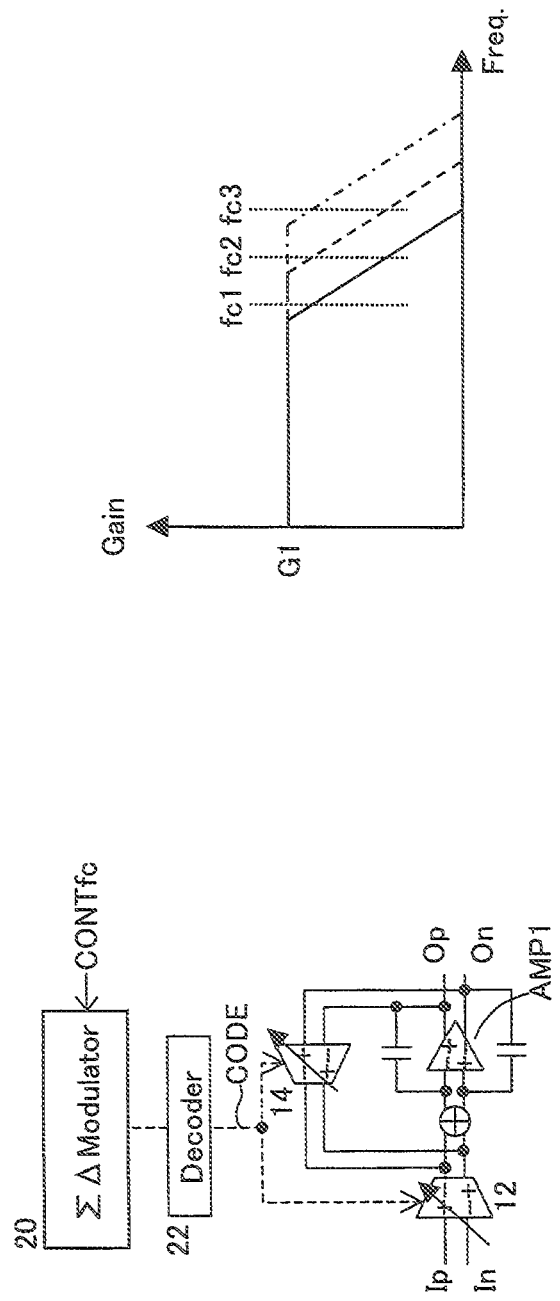
FIG. 15A and FIG. 15B are diagrams depicting an example of a second GmC filter and characteristics thereof.

FIG. 15A and FIG. 15B are diagrams depicting an example of a second GmC filter and characteristics thereof. The GmC filter depicted in FIG. 15A is a first order LPF, and the control codes CODE from the decoder 22 are provided to the input-side OTA 12 and the feedback-side OTA 14. Hence the Gm values of both the OTA 12 and the OTA 14 are variably-controlled according to the input setting value CONTfc, the cut-off frequency fc is variably-controlled by variably-controlling the Gm value of the feedback-side OTA 14, and the gain determined by the Gm values of the OTA 12 and the OTA 14 is kept at a fixed value G1. In other words, the frequency and gain characteristics in FIG. 153 are implemented. While the gain is kept at a predetermined value G1, the cut-off frequencies fc1, fc2 and fc3 are variably-controlled.

The frequency and gain characteristics in FIG. 15B is also obtained by controlling all the OTAs in the second order LPF in FIG. 10 and FIG. 12B using common control codes CODE.

Figures 16A, 16B:
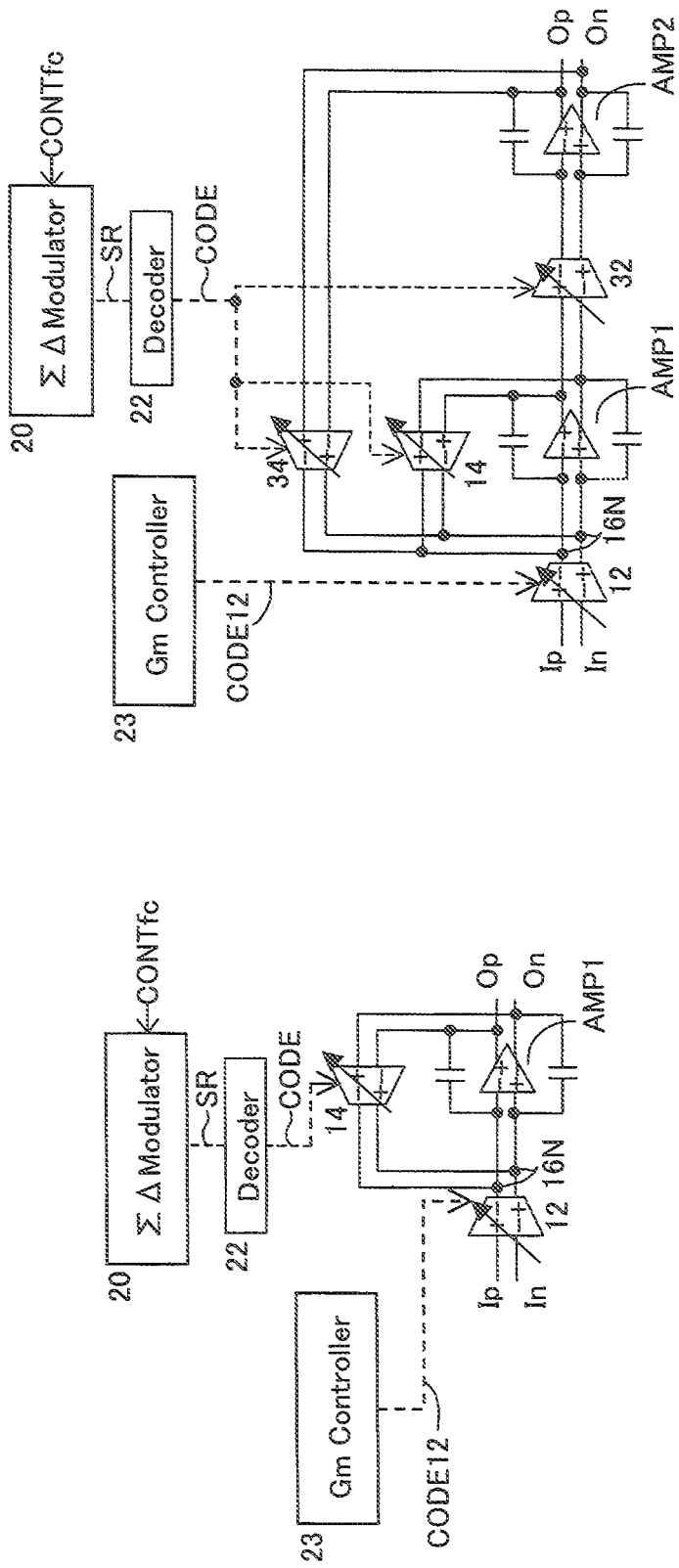
FIG. 16A and FIG. 16B are diagrams depicting an example of a third GmC filter.

FIG. 16A and FIG. 16B are diagrams depicting an example of a third GmC filter. FIG. 16A is an example of the first order LPF, and FIG. 16B is an example of the second order LPF. In both LPFs, the connection node 16N connecting the output of the input-side OTA 12 and the output of the feedback-side OTA 14 has a function of the adder 16. The configurations of these GmC filters are the same as the GmC filters depicted in FIG. 4, FIG. 6A and FIG. 10, except for the adder. All the OTAs 12, 14, 32 and 34 have the configuration depicted in FIG. 6A and FIG. 63 and FIG. 7A to FIG. 7D, where eight or several unit-OTAs are disposed in parallel.

In both the first order LPF and the second order LPF in FIG. 16A and FIG. 16B, the Gm value of the input-side OTA 12 is controlled by the control codes CODE 12 from the Gm control circuit 23. In the other OTAs, that is OTAs 14, 32 and 34, the Gm value thereof is controlled by the control codes CODE generated by decoding the pseudo-random values SR which the ΣΔ modulator 20 generates according to the input setting value CONTfc. In other words, in the OTA 14, 32 or 34, the Gm value thereof is controlled with high resolution based on the pseudo-random values SR. In the input-side OTA 12, on the other hand, the Gm value is variably-controlled to eight types or several types of Gm values using the control codes CODE 12 from the Gm control circuit 23.

Figure 17:
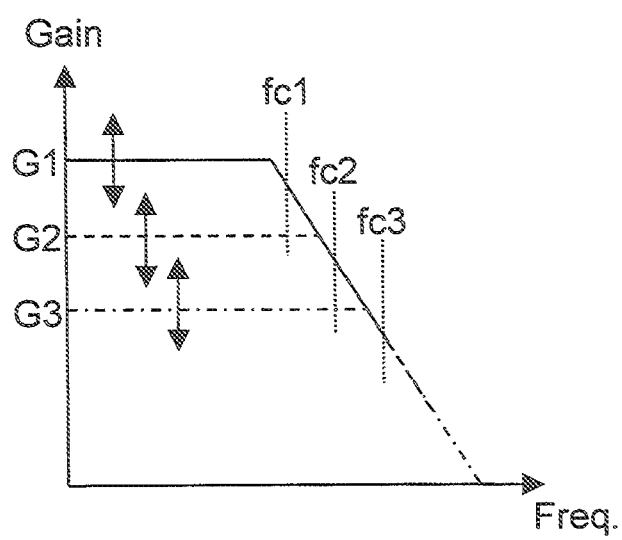
FIG. 17 is a diagram depicting the frequency and gain characteristics of the third GmC filter in FIG. 16A and FIG. 16B.

FIG. 17 is a diagram depicting the frequency and gain characteristics of the third GmC filter in FIG. 16A and FIG. 16B. The Gm values of the OTAs 14, 32 and 34 are variably-controlled by the control codes CODE based on the pseudo-random values SR generated by the ΣΔ modulator, whereby the cut-off frequencies fc1, fc2 and fc3 are variably-controlled with high resolution. If the Gm value of the input-side OTA 12 is maintained at a predetermined value in this case, the gain changes according to G1, G2 and G3 and the cut-off frequency fc1, fc2 and fc3, as depicted in FIG. 14B. Therefore each gain G1, G2 and G3 can be variably-controlled in eight steps, or in several steps using the control codes CODE 12 from the Gm control circuit 23, as indicated by the vertical arrow marks.

The frequency and gain characteristics in FIG. 17 is also obtained in the GmC filter in FIG. 6A and FIG. 63 and FIG. 10 or in the GmC filter of the second embodiment in FIG. 12A and FIG. 12B by variably-controlling the Gm value of each OTA in the same manner as FIG. 16A and FIG. 16B.

In the Gm filters in FIG. 6A and FIG. 6B, FIG. 10, FIG. 16A and FIG. 163 or FIG. 12A and FIG. 123, the Gm value of the input-side OTA 12 may be variably-controlled based on the pseudo-random values generated by a dedicated pseudo-random generation circuit (e.g. ΣΔ modulator). In this case, the gain can also be controlled with high resolution.

Furthermore if each OTA in FIG. 6A and FIG. 6B, FIG. 10, FIG. 12A and FIG. 12B or FIG. 16A and FIG. 16B is controlled by pseudo-random values generated by a mutually different pseudo-random generator, the offset frequency, the Q value of the filter and the gain is freely set.

As described above, the GmC filter of this embodiment as an LPF variably-controls the cut-off frequency with high resolution, even if the scale of the circuits constituting the OTA is decreased so as to decrease an occupying area on a chip.

The frequency-variable filter of the present invention variably-controls the frequency characteristics with high resolution, and has high applicability as an LPF of a receive circuit, for example.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

The invention claimed is:

1. A frequency-variable filter comprising:
    a GmC filter having a plurality of OTAs and a capacitor; and
    a pseudo-random value generator outputting pseudo-random values of which average value in a predetermined time corresponds to an input setting value, wherein
    at least an OTA for determining a cut-off frequency, out of the plurality of OTAs, is controlled so that transconductance thereof is variably-controlled according to the pseudo-random values, and the cut-off frequency is variably-controlled based on the input setting value.

2. The frequency-variable filter according to claim 1, wherein the GmC filter has:
    a first input-side OTA converting an input voltage at an input terminal of the frequency-variable filter to a current;
    a first capacitor for generating an output voltage to an output terminal based on an output current of the input-side OTA; and
    a first feedback-side OTA disposed between the output terminal and the first input-side OTA, and
    has a cut-off frequency corresponding to the transconductance of the first feedback-side OTA.

3. The frequency-variable filter according to claim 1, wherein the pseudo-random value generator is a ΣΔ modulator.

4. The frequency-variable filter according to claim 1, wherein
    the OTA variably-controlled according to the pseudo-random value has a plurality of unit-OTAs which are connected in parallel, and the outputs of the plurality of unit-OTAs are variably-controlled to have a positive phase or a negative phase respectively according to the pseudo-random value, so that the transconductance is variably-controlled.

5. The frequency-variable filter according to claim 4, further comprising a decoder for generating an N-bit control code corresponding to the pseudo-random value, wherein
    the outputs of the plurality of unit-OTAs are controlled to have a positive phase or a negative phase respectively according to the N-bit control code.

6. The frequency-variable filter according to claim 4, wherein
    in addition to the plurality of unit-OTAs, the OTA variably-controlled according to the pseudo-random value further has:
    a plurality of mixer circuits controlling an output current of each of the plurality of unit-OTAs to have a positive phase or a negative phase by using a control code corresponding to the pseudo-random value; and
    an addition circuit adding the output currents of the plurality of mixer circuits.

7. The frequency-variable filter according to claim 4, wherein
    the plurality of unit-OTAs have a pair of current sources, and a differential transistor pair that is connected to the pair of current sources and generates a pair of currents according to the input voltage, respectively.

8. The frequency-variable filter according to claim 1, wherein
    the GmC filter has a first operational amplifier which has the first capacitor and the first feedback-side OTA beteen an input and an output.

9. The frequency-variable filter according to claim 8, wherein the GmC filter further has:
    a second input-side OTA converting an output voltage of the first operational amplifier into a current;
    a second operational amplifier which generates an output voltage in an output terminal based on the output current of the second input-side OTA, and has a second capacitor between an input and an output; and
a second feedback-side OTA disposed between the output of the second operational amplifier and the first operational amplifier, and
the second input-side OTA and the second feedback-side OTA have a plurality of unit-OTAs connected in parallel, and the transconductance of the second input-side OTA and the second feedback-side OTA is variably-controlled by the polarity of the plurality of unit-OTAs that are variably-controlled according to the pseudo-random value.

10. The frequency-variable filter according to claim 8, wherein the GmC filter further has:
a second input-side OTA converting an output voltage of the first capacitor to a current;
a second capacitor which generates an output voltage in the output terminal based on the output current of the second input-side OTA; and
a second feedback-side OTA disposed between the second capacitor of the first capacitor, and
the second input-side OTA and the second feedback-side OTA have a plurality of unit-OTAs connected in parallel, and the transconductance of the second input-side OTA and the second feedback-side OTA is variably-controlled by the polarity of the plurality of the unit-OTAs that are variably-controlled according to the pseudo-random value.

11. The frequency-variable filter according to claim 4, wherein
the input-side OTA determining a gain also has a plurality of unit-OTAs connected in parallel, the outputs of the plurality of unit-OTAs of the input-side OTA are variably-controlled to have a positive phase or a negative phase according to the pseudo-random value, so that the transconductance of the first input-side OTA is variably-controlled.

12. The frequency-variable filter according to claim 4, wherein
the input-side OTA determining a gain also has a plurality of unit-OTAs connected in parallel, the outputs of the plurality of unit-OTAs of the input-side OTA are variably-controlled to have a positive phase or a negative phase according to a gain control value that is different from the pseudo-random value, so that the transconductance of the first input-side OTA is variably-controlled.

13. The frequency-variable filter according to claim 6, wherein
the addition circuit has a current source, and a cascade-connected transistor pair, which is connected to the current source, and output currents of the plurality of mixer circuits are supplied to the connection terminals of the cascade transistor pair, and the output currents of the first feedback OTA are output from the connection terminals of the current source and the cascade transistor pair.

14. The frequency-variable filter according to claim 1 or 2, wherein
the plurality of OTAs variably-controlled by the pseudo-random signal are controlled by a plurality of pseudo-random generators which generate a plurality of different pseudo-random values.

15. A receiving device, comprising: the frequency-variable filter according to claim 1, the receiving device further comprising:
a down-convert mixer which down-converts a high frequency receive signal and outputs the down-converted receive signal to the frequency-variable filter; and
a receive signal processing unit which processes the down-converted receive signal, and supplies the input setting value to the frequency-variable filter.

\* \* \* \* \*